United States Patent
Miller et al.

(10) Patent No.: US 7,699,932 B2
(45) Date of Patent: Apr. 20, 2010

(54) REACTORS, SYSTEMS AND METHODS FOR DEPOSITING THIN FILMS ONTO MICROFEATURE WORKPIECES

(75) Inventors: Matthew W. Miller, Meridian, ID (US); Cem Basceri, Reston, VA (US)

(73) Assignee: Micron Technology, Inc., Boise, ID (US)

(*) Notice: Subject to any disclaimer, the term of this patent is extended or adjusted under 35 U.S.C. 154(b) by 674 days.

(21) Appl. No.: 10/859,883

(22) Filed: Jun. 2, 2004

(65) Prior Publication Data

US 2005/0268856 A1 Dec. 8, 2005

(51) Int. Cl.
*C23C 16/00* (2006.01)
*C23C 16/455* (2006.01)
*C23C 16/458* (2006.01)
*H01L 21/306* (2006.01)

(52) U.S. Cl. .................. 118/715; 118/729; 156/345.33; 156/345.34; 156/345.54

(58) Field of Classification Search .................. 118/715, 118/728, 729; 156/345.29, 345.33, 345.34, 156/345.54
See application file for complete search history.

(56) References Cited

U.S. PATENT DOCUMENTS

| | | | |
|---|---|---|---|
| 127,031 A | 5/1872 | Dayton | |
| 131,943 A | 10/1872 | Dayton | |
| 579,269 A | 3/1897 | Hent | |
| 1,741,519 A | 12/1929 | Huff | |
| 2,508,500 A | 5/1950 | de Lange | |
| RE24,291 E | 3/1957 | Goodyer | |
| 3,522,836 A | 8/1970 | King | |
| 3,618,919 A | 11/1971 | Beck | |
| 3,620,934 A | 11/1971 | Endle | |

(Continued)

FOREIGN PATENT DOCUMENTS

DE  4003882 A1  8/1991

(Continued)

OTHER PUBLICATIONS

Kawahara, T. et al., "Step Coverage and Electrical Properties of (BA,Sr)TiO3 Films Prepared by Liquid Source Chemical Vapor Deposition," Electrochemical Society Proceedings, vol. 98-3, pp. 190-195.

(Continued)

*Primary Examiner*—Jeffrie R Lund
(74) *Attorney, Agent, or Firm*—Perkins Coie LLP

(57) ABSTRACT

A reactor, system including reactors, and methods for depositing thin films on microfeature workpieces comprising a reaction vessel having a chamber, a gas distributor attached to the reaction vessel, a workpiece holder in the chamber, and a side unit in the reaction vessel at a location relative to the gas distributor and/or the workpiece holder. The gas distributor has a plurality of primary outlets open to the chamber, and the workpiece holder has a process site aligned with the primary outlets. The side unit has a secondary outlet open to the chamber that operates independently of the primary outlets. One of the inner compartment, the side unit and/or the workpiece holder can be movable between a first position to form a small-volume cell for introducing the reactant gases to the microfeature workpiece and a second position to form a large volume space for purging the reactant gases.

16 Claims, 6 Drawing Sheets

U.S. PATENT DOCUMENTS

| | | |
|---|---|---|
| 3,630,769 A | 12/1971 | Hart et al. |
| 3,630,881 A | 12/1971 | Lester |
| 3,634,212 A | 1/1972 | Valayll et al. |
| 3,744,771 A | 7/1973 | Deaton |
| 3,945,804 A | 3/1976 | Shang et al. |
| 4,018,949 A | 4/1977 | Donakowski et al. |
| 4,022,928 A | 5/1977 | Piwcyzk et al. |
| 4,098,923 A | 7/1978 | Alberti et al. |
| 4,242,182 A | 12/1980 | Popescu et al. |
| 4,242,370 A | 12/1980 | Abdalla et al. |
| 4,269,625 A | 5/1981 | Molenaar et al. |
| 4,289,061 A | 9/1981 | Emmett |
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |
| 4,469,801 A | 9/1984 | Hirai et al. |
| 4,492,716 A | 1/1985 | Yamazaki et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,595,399 A | 6/1986 | Collins et al. |
| 4,615,904 A | 10/1986 | Ehrlich et al. |
| 4,681,777 A | 7/1987 | Engelken et al. |
| 4,721,629 A | 1/1988 | Sakai et al. |
| 4,738,295 A | 4/1988 | Genser et al. |
| 4,741,354 A | 5/1988 | DeMild, Jr. |
| 4,780,178 A | 10/1988 | Yoshida et al. |
| 4,821,302 A | 4/1989 | Whitlock et al. |
| 4,826,579 A | 5/1989 | Westfall |
| 4,832,115 A | 5/1989 | Albers et al. |
| 4,871,417 A | 10/1989 | Nishizawa et al. |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,962,057 A | 10/1990 | Epler et al. |
| 4,966,646 A | 10/1990 | Zdeblick |
| 4,977,106 A | 12/1990 | Smith |
| 4,988,879 A | 1/1991 | Zare et al. |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,065,697 A | 11/1991 | Yoshida et al. |
| 5,076,205 A | 12/1991 | Vowles et al. |
| 5,090,985 A | 2/1992 | Soubeyrand |
| 5,091,207 A | 2/1992 | Tanaka et al. |
| 5,131,460 A | 7/1992 | Krueger |
| 5,131,752 A | 7/1992 | Yu et al. |
| 5,136,975 A | 8/1992 | Bartholomew et al. |
| 5,139,606 A | 8/1992 | Maki |
| 5,172,849 A | 12/1992 | Barten et al. |
| 5,178,683 A | 1/1993 | Takamura et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell et al. |
| 5,364,219 A | 11/1994 | Takahashi et al. |
| 5,366,557 A | 11/1994 | Yu |
| 5,372,837 A | 12/1994 | Shimoyama et al. |
| 5,377,429 A | 1/1995 | Sandhu et al. |
| 5,378,502 A | 1/1995 | Willard et al. |
| 5,380,396 A | 1/1995 | Shikida et al. |
| 5,409,129 A | 4/1995 | Tsukada et al. |
| 5,418,180 A | 5/1995 | Brown |
| 5,421,957 A | 6/1995 | Carlson et al. |
| 5,427,666 A | 6/1995 | Mueller et al. |
| 5,432,015 A | 7/1995 | Wu et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,474,612 A | 12/1995 | Sato et al. |
| 5,477,623 A | 12/1995 | Tomizawa et al. |
| 5,480,818 A | 1/1996 | Matsumoto et al. |
| 5,496,410 A | 3/1996 | Fukuda et al. |
| 5,498,292 A | 3/1996 | Ozaki et al. |
| 5,500,256 A | 3/1996 | Watabe et al. |
| 5,505,986 A | 4/1996 | Velthaus et al. |
| 5,522,934 A | 6/1996 | Suzuki et al. |
| 5,527,396 A | 6/1996 | Saitoh et al. |
| 5,532,190 A * | 7/1996 | Goodyear et al. ........... 438/710 |
| 5,536,317 A | 7/1996 | Crain et al. |
| 5,558,717 A | 9/1996 | Zhao et al. |
| 5,562,800 A | 10/1996 | Kawamura et al. |
| 5,569,350 A | 10/1996 | Osada et al. |
| 5,575,883 A | 11/1996 | Nishikawa et al. |
| 5,589,002 A | 12/1996 | Su |
| 5,589,110 A | 12/1996 | Motoda et al. |
| 5,592,581 A | 1/1997 | Okase et al. |
| 5,595,606 A | 1/1997 | Fujikawa et al. |
| 5,599,513 A | 2/1997 | Masaki et al. |
| 5,609,798 A | 3/1997 | Liu et al. |
| 5,624,498 A | 4/1997 | Lee et al. |
| 5,626,936 A | 5/1997 | Alderman |
| 5,640,751 A | 6/1997 | Faria |
| 5,641,545 A | 6/1997 | Sandhu |
| 5,643,394 A | 7/1997 | Maydan et al. |
| 5,654,589 A | 8/1997 | Huang et al. |
| 5,658,503 A | 8/1997 | Johnston et al. |
| 5,683,538 A | 11/1997 | O'Neill et al. |
| 5,693,288 A | 12/1997 | Nakamura et al. |
| 5,716,796 A | 2/1998 | Bull et al. |
| 5,729,896 A | 3/1998 | Dalal et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino et al. |
| 5,772,771 A | 6/1998 | Li et al. |
| 5,773,085 A | 6/1998 | Inoue et al. |
| 5,788,778 A | 8/1998 | Shang et al. |
| 5,792,269 A | 8/1998 | Deacon et al. |
| 5,792,272 A | 8/1998 | van Os et al. |
| 5,792,700 A | 8/1998 | Turner et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,820,686 A | 10/1998 | Moore |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,865,887 A | 2/1999 | Wijaranakula et al. |
| 5,866,986 A | 2/1999 | Pennington |
| 5,868,159 A | 2/1999 | Loan et al. |
| 5,879,459 A | 3/1999 | Gadgil et al. |
| 5,879,516 A | 3/1999 | Kasman |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |

| Patent No. | Date | Inventor |
|---|---|---|
| 5,936,829 A | 8/1999 | Moslehi |
| 5,940,684 A | 8/1999 | Shakuda et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,963,336 A | 10/1999 | McAndrew et al. |
| 5,968,275 A | 10/1999 | Lee et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,016,611 A | 1/2000 | White et al. |
| 6,022,483 A | 2/2000 | Aral |
| 6,025,110 A | 2/2000 | Nowak |
| 6,026,762 A | 2/2000 | Kao et al. |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A * | 5/2000 | Ohashi et al. ............... 118/730 |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |
| 6,143,659 A | 11/2000 | Leem et al. |
| 6,144,060 A | 11/2000 | Park et al. |
| 6,149,123 A | 11/2000 | Harris et al. |
| 6,156,393 A | 12/2000 | Polanyi et al. |
| 6,159,297 A | 12/2000 | Herchen et al. |
| 6,159,298 A | 12/2000 | Saito et al. |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola et al. |
| 6,174,377 B1 | 1/2001 | Doering et al. |
| 6,174,809 B1 | 1/2001 | Kang et al. |
| 6,178,660 B1 | 1/2001 | Emmi et al. |
| 6,179,923 B1 | 1/2001 | Yamamoto et al. |
| 6,182,603 B1 | 2/2001 | Shang et al. |
| 6,183,563 B1 | 2/2001 | Choi et al. |
| 6,190,459 B1 | 2/2001 | Takeshita et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,199,465 B1 | 3/2001 | Hattori et al. |
| 6,200,415 B1 | 3/2001 | Maraschin |
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Mathews |
| 6,214,714 B1 | 4/2001 | Wang et al. |
| 6,217,704 B1 | 4/2001 | Kitagawa et al. |
| 6,237,394 B1 | 5/2001 | Harris et al. |
| 6,237,529 B1 | 5/2001 | Spahn |
| 6,245,192 B1 | 6/2001 | Dhindsa et al. |
| 6,251,190 B1 | 6/2001 | Mak et al. |
| 6,255,222 B1 | 7/2001 | Xia et al. |
| 6,263,829 B1 | 7/2001 | Schneider et al. |
| 6,264,788 B1 | 7/2001 | Tomoyasu et al. |
| 6,270,572 B1 | 8/2001 | Kim et al. |
| 6,273,954 B2 | 8/2001 | Nishikawa et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,321,680 B2 | 11/2001 | Cook et al. |
| 6,328,803 B2 | 12/2001 | Rolfson et al. |
| 6,329,297 B1 | 12/2001 | Balish et al. |
| 6,333,272 B1 | 12/2001 | McMillin et al. |
| 6,334,928 B1 | 1/2002 | Sekine et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,364,219 B1 | 4/2002 | Zimmerman et al. |
| 6,374,831 B1 | 4/2002 | Chandran et al. |
| 6,383,300 B1 | 5/2002 | Saito et al. |
| 6,387,185 B2 | 5/2002 | Doering et al. |
| 6,387,207 B1 | 5/2002 | Janakiraman et al. |
| 6,387,324 B1 | 5/2002 | Patterson et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,425,168 B1 | 7/2002 | Takaku et al. |
| 6,428,859 B1 | 8/2002 | Chiang et al. |
| 6,432,256 B1 | 8/2002 | Raoux |
| 6,432,259 B1 | 8/2002 | Noorbakhsh et al. |
| 6,432,831 B2 | 8/2002 | Dhindsa et al. |
| 6,435,865 B1 | 8/2002 | Tseng et al. |
| 6,444,039 B1 * | 9/2002 | Nguyen ..................... 118/715 |
| 6,450,117 B1 | 9/2002 | Murugesh et al. |
| 6,451,119 B2 | 9/2002 | Sneh et al. |
| 6,454,912 B1 | 9/2002 | Ahn et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,474,700 B2 | 11/2002 | Redemann et al. |
| 6,475,336 B1 | 11/2002 | Hubacek |
| 6,486,081 B1 | 11/2002 | Ishikawa et al. |
| 6,503,330 B1 | 1/2003 | Sneh et al. |
| 6,506,254 B1 | 1/2003 | Bosch et al. |
| 6,507,007 B2 | 1/2003 | Van Bilsen |
| 6,508,268 B1 | 1/2003 | Kouketsu et al. |
| 6,509,280 B2 | 1/2003 | Choi et al. |
| 6,534,007 B1 | 3/2003 | Blonigen et al. |
| 6,534,395 B2 | 3/2003 | Werkhoven et al. |
| 6,534,423 B1 | 3/2003 | Turner |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |

| | | |
|---|---|---|
| 6,573,184 B2 | 6/2003 | Park et al. |
| 6,579,372 B2 | 6/2003 | Park et al. |
| 6,579,374 B2 | 6/2003 | Bondestam et al. |
| 6,585,823 B1 | 7/2003 | Van Wijck |
| 6,589,868 B2 | 7/2003 | Rossman |
| 6,592,709 B1 | 7/2003 | Lubomirsky |
| 6,596,085 B1 | 7/2003 | Schmitt et al. |
| 6,602,346 B1 | 8/2003 | Gochberg et al. |
| 6,610,352 B2 | 8/2003 | Cheong et al. |
| 6,613,656 B2 | 9/2003 | Li |
| 6,622,104 B2 | 9/2003 | Wang et al. |
| 6,630,201 B2 | 10/2003 | Chiang et al. |
| 6,634,314 B2 | 10/2003 | Hwang et al. |
| 6,635,965 B1 | 10/2003 | Lee et al. |
| 6,638,672 B2 | 10/2003 | Deguchi et al. |
| 6,638,859 B2 | 10/2003 | Sneh et al. |
| 6,638,879 B2 | 10/2003 | Hsieh et al. |
| 6,641,673 B2 | 11/2003 | Yang |
| 6,656,282 B2 | 12/2003 | Kim et al. |
| 6,656,540 B2 | 12/2003 | Sakamoto et al. |
| 6,663,713 B1 | 12/2003 | Robles et al. |
| 6,666,982 B2 | 12/2003 | Brcka |
| 6,673,196 B1 | 1/2004 | Oyabu et al. |
| 6,676,759 B1 | 1/2004 | Takagi et al. |
| 6,686,594 B2 | 2/2004 | Ji et al. |
| 6,689,220 B1 | 2/2004 | Nguyen |
| 6,704,913 B2 | 3/2004 | Rossman |
| 6,705,345 B1 | 3/2004 | Bifano |
| 6,706,334 B1 | 3/2004 | Kobayashi et al. |
| 6,716,284 B2 | 4/2004 | Campbell et al. |
| 6,734,020 B2 | 5/2004 | Lu et al. |
| 6,758,911 B2 | 7/2004 | Campbell et al. |
| 6,770,145 B2 | 8/2004 | Saito et al. |
| 6,773,507 B2 | 8/2004 | Jallepally et al. |
| 6,787,185 B2 | 9/2004 | Derderian et al. |
| 6,787,463 B2 | 9/2004 | Mardian et al. |
| 6,796,316 B2 | 9/2004 | Park et al. |
| 6,800,139 B1 | 10/2004 | Shinriki et al. |
| 6,800,173 B2 | 10/2004 | Chiang et al. |
| 6,807,971 B2 | 10/2004 | Saito et al. |
| 6,814,813 B2 | 11/2004 | Dando et al. |
| 6,818,067 B2 | 11/2004 | Doering et al. |
| 6,818,249 B2 | 11/2004 | Derderian |
| 6,820,570 B2 | 11/2004 | Kilpela et al. |
| 6,821,347 B2 | 11/2004 | Carpenter et al. |
| 6,828,218 B2 | 12/2004 | Kim et al. |
| 6,830,652 B1 | 12/2004 | Ohmi et al. |
| 6,831,315 B2 | 12/2004 | Raaijmakers et al. |
| 6,838,114 B2 | 1/2005 | Carpenter et al. |
| 6,845,734 B2 | 1/2005 | Carpenter et al. |
| 6,849,131 B2 | 2/2005 | Chen et al. |
| 6,858,120 B2 | 2/2005 | Ahn et al. |
| 6,858,264 B2 | 2/2005 | Dando et al. |
| 6,861,094 B2 | 3/2005 | Derderian et al. |
| 6,861,356 B2 | 3/2005 | Matsuse et al. |
| 6,869,500 B2 | 3/2005 | Lee et al. |
| 6,877,726 B1 | 4/2005 | Rindt et al. |
| 6,878,402 B2 | 4/2005 | Chiang et al. |
| 6,881,295 B2 | 4/2005 | Nagakura et al. |
| 6,884,296 B2 | 4/2005 | Basceri et al. |
| 6,887,521 B2 | 5/2005 | Basceri |
| 6,890,386 B2 | 5/2005 | DeDontney et al. |
| 6,905,547 B1 | 6/2005 | Londergan et al. |
| 6,905,549 B2 | 6/2005 | Okuda et al. |
| 6,916,398 B2 | 7/2005 | Chen et al. |
| 6,926,775 B2 | 8/2005 | Carpenter et al. |
| 6,927,076 B2 | 8/2005 | Chen et al. |
| 6,955,725 B2 | 10/2005 | Dando |
| 6,966,936 B2 | 11/2005 | Yamasaki et al. |
| 6,991,684 B2 | 1/2006 | Kannan et al. |
| 7,022,184 B2 | 4/2006 | Van Wijck et al. |
| 7,056,806 B2 | 6/2006 | Basceri et al. |
| 7,086,410 B2 | 8/2006 | Chouno et al. |
| 7,153,396 B2 | 12/2006 | Genser et al. |
| 7,169,231 B2 | 1/2007 | Larson et al. |
| 7,238,294 B2 | 7/2007 | Koops et al. |
| 7,311,947 B2 | 12/2007 | Dando et al. |
| 7,371,332 B2 | 5/2008 | Larson et al. |
| 2001/0001952 A1 | 5/2001 | Nishizawa et al. |
| 2001/0012697 A1 | 8/2001 | Mikata |
| 2001/0020447 A1 | 9/2001 | Murugesh et al. |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0016044 A1 | 2/2002 | Dreybrodt et al. |
| 2002/0020498 A1 | 2/2002 | Ohmi et al. |
| 2002/0042205 A1 | 4/2002 | McMillin et al. |
| 2002/0073924 A1 | 6/2002 | Chiang et al. |
| 2002/0076507 A1 | 6/2002 | Chiang et al. |
| 2002/0076508 A1 | 6/2002 | Chiang et al. |
| 2002/0088547 A1 | 7/2002 | Tomoyasu et al. |
| 2002/0100418 A1 | 8/2002 | Sandhu et al. |
| 2002/0104481 A1 | 8/2002 | Chiang et al. |
| 2002/0129768 A1 | 9/2002 | Carpenter et al. |
| 2002/0132374 A1* | 9/2002 | Basceri et al. ................ 438/3 |
| 2002/0144655 A1 | 10/2002 | Chiang et al. |
| 2002/0185067 A1 | 12/2002 | Upham |
| 2002/0192369 A1 | 12/2002 | Morimoto et al. |
| 2002/0195056 A1 | 12/2002 | Sandhu et al. |
| 2002/0195145 A1 | 12/2002 | Lowery et al. |
| 2002/0195201 A1 | 12/2002 | Beer et al. |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0031794 A1 | 2/2003 | Tada et al. |
| 2003/0049372 A1 | 3/2003 | Cook et al. |
| 2003/0066483 A1 | 4/2003 | Lee et al. |
| 2003/0090676 A1 | 5/2003 | Goebel et al. |
| 2003/0094903 A1 | 5/2003 | Tao et al. |
| 2003/0098372 A1 | 5/2003 | Kim |
| 2003/0121608 A1 | 7/2003 | Chen et al. |
| 2003/0185979 A1 | 10/2003 | Nelson |
| 2003/0192645 A1 | 10/2003 | Liu et al. |
| 2003/0213435 A1 | 11/2003 | Okuda et al. |
| 2003/0232892 A1 | 12/2003 | Guerra-Santos et al. |
| 2004/0000270 A1 | 1/2004 | Carpenter et al. |
| 2004/0003777 A1 | 1/2004 | Carpenter et al. |
| 2004/0007188 A1 | 1/2004 | Burkhart et al. |
| 2004/0025786 A1 | 2/2004 | Kontani et al. |
| 2004/0029379 A1 | 2/2004 | Yamasaki et al. |
| 2004/0040502 A1 | 3/2004 | Basceri et al. |
| 2004/0040503 A1 | 3/2004 | Basceri et al. |
| 2004/0083959 A1 | 5/2004 | Carpenter et al. |
| 2004/0083960 A1 | 5/2004 | Dando |
| 2004/0083961 A1 | 5/2004 | Basceri |
| 2004/0089240 A1 | 5/2004 | Dando et al. |
| 2004/0094095 A1 | 5/2004 | Huang et al. |
| 2004/0099377 A1 | 5/2004 | Newton et al. |
| 2004/0124131 A1 | 7/2004 | Aitchison et al. |
| 2004/0226507 A1 | 11/2004 | Carpenter et al. |
| 2004/0226516 A1 | 11/2004 | Daniel et al. |
| 2004/0238123 A1 | 12/2004 | Becknell et al. |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0034815 A1 | 2/2005 | Kasai et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |

| | | | |
|---|---|---|---|
| 2005/0048742 A1 | 3/2005 | Dip et al. | |
| 2005/0061243 A1 | 3/2005 | Sarigiannis et al. | |
| 2005/0081786 A1 | 4/2005 | Kubista et al. | |
| 2005/0087130 A1 | 4/2005 | Derderian | |
| 2005/0087132 A1 | 4/2005 | Dickey et al. | |
| 2005/0087302 A1 | 4/2005 | Mardian et al. | |
| 2005/0103275 A1 | 5/2005 | Sasaki et al. | |
| 2005/0120954 A1 | 6/2005 | Carpenter et al. | |
| 2005/0126489 A1 | 6/2005 | Beaman et al. | |
| 2005/0133161 A1 | 6/2005 | Carpenter et al. | |
| 2005/0145337 A1 | 7/2005 | Derderian et al. | |
| 2005/0164466 A1 | 7/2005 | Zheng et al. | |
| 2005/0217575 A1 | 10/2005 | Gealy et al. | |
| 2005/0217582 A1 | 10/2005 | Kim et al. | |
| 2005/0249873 A1 | 11/2005 | Sarigiannis et al. | |
| 2005/0249887 A1 | 11/2005 | Dando et al. | |
| 2005/0268856 A1* | 12/2005 | Miller et al. | 118/729 |
| 2006/0115957 A1 | 6/2006 | Basceri et al. | |
| 2006/0121689 A1 | 6/2006 | Basceri et al. | |
| 2006/0134345 A1 | 6/2006 | Rueger et al. | |
| 2006/0165873 A1 | 7/2006 | Rueger et al. | |
| 2006/0198955 A1 | 9/2006 | Zheng et al. | |
| 2006/0204649 A1 | 9/2006 | Beaman et al. | |
| 2006/0205187 A1 | 9/2006 | Zheng et al. | |
| 2006/0213440 A1 | 9/2006 | Zheng et al. | |
| 2006/0237138 A1 | 10/2006 | Qin | |

FOREIGN PATENT DOCUMENTS

| | | |
|---|---|---|
| DE | 19851824 A1 | 5/2000 |
| EP | 140246 | 5/1985 |
| EP | 0720418 | 7/1996 |
| EP | 740490 | 10/1996 |
| EP | 1 167 569 A1 | 1/2002 |
| GB | 1065762 | 4/1967 |
| GB | 1469230 | 4/1977 |
| JP | 55108944 A | 8/1980 |
| JP | 60-54443 | 3/1985 |
| JP | 61292894 | 12/1986 |
| JP | 62-235728 | 10/1987 |
| JP | 62-263629 | 11/1987 |
| JP | 63-020490 A | 1/1988 |
| JP | 63-111177 A | 5/1988 |
| JP | 63-234198 | 9/1988 |
| JP | 63-256460 A | 10/1988 |
| JP | 63259067 | 10/1988 |
| JP | 64-081311 A | 3/1989 |
| JP | 01-273991 A | 11/1989 |
| JP | 02208925 A | 8/1990 |
| JP | 2306591 | 12/1990 |
| JP | 03-174717 | 7/1991 |
| JP | 04064225 A | 2/1992 |
| JP | 04069933 A | 3/1992 |
| JP | 04-100533 A | 4/1992 |
| JP | 04-213818 A | 8/1992 |
| JP | 05024975 A | 2/1993 |
| JP | 05102025 A | 4/1993 |
| JP | 06-151558 A | 5/1994 |
| JP | 06172979 A | 6/1994 |
| JP | 06-201539 | 7/1994 |
| JP | 06-202372 | 7/1994 |
| JP | 06-342785 A | 12/1994 |
| JP | 7263144 | 10/1995 |
| JP | 08-034678 A | 2/1996 |
| JP | 08179307 A | 7/1996 |
| JP | 09-082650 A | 3/1997 |
| JP | 10-008255 | 1/1998 |
| JP | 10200091 A | 7/1998 |
| JP | 10-223719 A | 8/1998 |
| JP | 11-172438 A | 6/1999 |
| JP | 2001-082682 A | 3/2001 |
| JP | 2001-261375 A | 9/2001 |
| JP | 2002-164336 A | 6/2002 |
| JP | 2001-254181 A | 9/2002 |
| KR | 2005112371 | 11/2005 |
| SU | 598630 | 3/1978 |
| WO | WO-98/37258 A1 | 8/1998 |
| WO | WO-99/06610 A1 | 2/1999 |
| WO | WO-00/4077 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/32966 A1 | 5/2001 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |
| WO | WO-02/073660 A2 | 9/2002 |
| WO | WO-02/074771 A2 | 10/2002 |
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

Eguchi, K. et al., "Composition Self-Matching Phenomena in Chemical Vapor Deposition of (Ba,Sr)TiO3 Thin Films," Electrochemical Society Proceedings vol. 98-3, pp. 179-189.

Wright, D.R., et. al., "Maufacturing issues of electrostatic chucks," J. Vac. Sci. Technol. B 13(4), pp. 1910-1916, Jul./Aug. 1995, American Vacuum Society.

"Selective Deposition with 'Dry' Vaporizable Lift-Off Mask," IBM Technical Disclosure Bulletin, vol. 35, Issue 1A, pp. 75-76, Jun. 1, 1992.

Aera Corporation, "Fundamentals of Mass Flow Control," 1 page, retrieved from the Internet on Mar. 6, 2003, <http://www.aeramfc.com/funda.shtml>.

Bardell, R.L., et al., "Designing High-Performance Micro-Pumps Based on No-Moving-Parts Valves", Dsc-vol. 62/HTD-vol. 354, Microelectromechanical Systems (MEMS) ASME 1997, pp. 47-53.

Cameron, Ian, "Atomic Layer Deposition Chamber Works at Low Temperatures", 2 pages, Electronic Times, Jul. 19, 2001, <http://www.electronictimes.com/story/OEG20010719S0042>.

Cowin, J.P., et al., "Measurement of Fast Desorption Kinetics of D2 From Tungsten by Laser Induced Thermal Desorption," Surface Science, Vol. 78, pp. 545-564, 1978, North-Holland Publishing Company.

Cutting Edge Optronics, 600W Qcw Laser Diode Array, Part Number: ARR48P600, 2 pages, Oct. 2001, <www.ceolaser.com>.

Deublin Company, "Precision Rotating Connections for Water, Steam, Air, Hydraulic, Vacuum, Coolant and Hot Oil Service", 1 page, retrieved from the Internet on Feb. 4, 2002, <http://www.deublin.com>.

Deublin Company, "Rotating Unions", 1 page, retrieved from the Internet on Feb. 4, 2002, <http://www.deublin.com/products/rotatingunions.htm>.

Deublin Company, "Sealing", 2 pages, retrieved from the Internet on Feb. 4, 2002, <http://www.deublin.com/products/sealing.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

EMCO Flow Systems, "Mach One Mass Flow Controllers", 1 page, retrieved from the Internet on Nov. 7, 2003, <http://emcoflow.com/mach-one.htm>.

Engelke, F. et al., "Determination of Phenylthiohydantoin-Amino Acids by Two-Step Laser Desorption/Multiphoton Ionization," Anal. Chem., vol. 59, pp. 909-912, 1987.

Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).

Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., "Microfluidic MEMS," Proceedings, IEEE Aerospace Conference, Paper. 4.906 (IEEE Press, Piscataway, NJ, 1998), 16 pages.

Henning, A.K., et al., "A thermopneumatically actuated microvalve for liquid expansion and proportional control", Proceedings, Transducers '97: 1997 International Solid State Sensors and Actuators Conference, pp. 825-828.

Henning, A.K., et al., "Microfluidic MEMS for Semiconductor Processing," IEEE Trans. Components, Packaging, and Manufacturing Technology B21, pp. 329-337, 1998.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Integrated Process Systems Ltd., "Welcome to IPS Ltd.", 1 page, retrieved from the Internet on Dec. 11, 2001, <http://www.ips-tech.com/eng/main.htm>.

Integrated Process Systems Ltd., "ALD & CVD", 2 pages, retrieved from the Internet on Dec. 11, 2001, <http://www.ips-tech.com/eng/pro-p2-2.htm>.

Integrated Process Systems Ltd., "Nano-ALD", 2 pages, retrieved from the Internet on Dec. 11, 2001, <http://www.ips-tech.com/eng/pro-p2.htm>.

Maillefer, D., et al., "A High-Performance Silicon Micropump for Disposable Drug Delivery Systems," pp. 413-417, IEEE, 2001.

MKS Instruments, ASTeX® Microwave Plasma Sources and Subsystems, 1 page, retrieved from the Internet on Nov. 19, 2004, <http://www.mksinst.com/PRG2.html>.

MKS Instruments, Data Sheet, Downstream Plasma Source, Type AX7610, 4 pages, Dec. 2002, <http://www.mksinst.com/docs/UR/ASTEXax7610DS.pdf>.

Olsson, A., "Valve-less Diffuser Micropumps", ISSN 0281-2878, 66 pages, 1998.

Peters, Laura, "Thermal Processing's Tool of Choice: Single-Wafer RTP or Fast Ramp Batch?" Semiconductor International, Apr. 1, 1998, 8 pages.

Ready, J., "Effects Due to Absorption of Laser Radiation," J. App. Physics, vol. 36, pp. 462-468, 1965.

SemiZone, EMCO Flow Systems Granted Patent for the Mach One Mass Flow Controller for the Semiconductor Industry (Jun. 28, 2001), 2 pages, retrieved from the Internet on Nov. 7, 2003, <http://www.semizone.com/news/item?news_item_id+100223>.

Takahashi, K et al., "Process Integration of 3D Chip Stack with Vertical Interconnection," pp. 601-609, 2004 Electronic Components and Technology Conference, IEEE, Jun. 2004.

The University of Adelaide, Department of Chemistry, "Spectroscopy", 2 pages, retrieved from the Internet on Feb. 9, 2002, <http://www.chemistry.adelaide.edu.au/extrnal/Soc-Rel/Content/spectros.htm>.

Tokyo Electron Limited, Plasma Process System Trias® SPA, 1 page, retrieved from the Internet on Jul. 16, 2003, <http://www.tel.com/eng/products/spe/sdtriasspa.htm>.

University of California, Berkeley—University Extension, "Atomic Layer Deposition", 5 pages, Sep. 24-25, 2001, <http://www.unex.berkeley.edu/eng/br335/1-1.html>.

Zare, R.N. et al., "Mass Spectrometry of Molecular Adsorbates Using Laser Desorption/Laser Multiphoton Ionization," Bull. Chem. Soc. Jpn., vol. 61, pp. 87-92, 1988.

U.S. Appl. No. 09/651,037, Mardian, Aug. 30, 2000.

* cited by examiner

REACTORS, SYSTEMS AND METHODS FOR DEPOSITING THIN FILMS ONTO MICROFEATURE WORKPIECES

TECHNICAL FIELD

This invention is directed toward reactors, systems and methods for depositing thin films onto microfeature workpieces.

BACKGROUND

Thin film deposition techniques are widely used in the manufacturing of microfeatures to form a coating on a workpiece that closely conforms to the surface topography. The size of the individual components in the workpiece is constantly decreasing, and the number of layers in the workpiece is increasing. As a result, both the density of components and the aspect ratios of depressions (i.e., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors capable of reacting to form a solid film are mixed while in a gaseous or vaporous state, and then the precursor mixture is presented to the surface of the workpiece. The surface of the workpiece catalyzes the reaction between the precursors to form a solid film at the workpiece surface. To catalyze the reaction, the workpiece is typically heated to a desired temperature.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer or partial layer of gas molecules $A_x$ coats the surface of a workpiece W. The layer of $A_x$ molecules is formed by exposing the workpiece W to a precursor gas containing $A_x$ molecules and then purging the chamber with a purge gas to remove excess $A_x$ molecules. This process can form a monolayer or partial monolayer of $A_x$ molecules on the surface of the workpiece W because the $A_x$ molecules at the surface are held in place by physical adsorption forces at moderate temperatures or chemisorption forces at higher temperatures. Referring to FIG. 1B, the layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin film using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film having the desired thickness. For example, each cycle may form a layer or partial layer having a thickness of approximately 0.1-1.0 Å, and thus several cycles are required to form a layer having a thickness of approximately 60 Å.

FIG. 3 schematically illustrates a single-wafer ALD reactor 10 having a reaction chamber 20 coupled to a gas supply 30 and a vacuum 40. The reactor 10 also includes a workpiece holder 50 that supports the workpiece W and a gas dispenser 60 in the reaction chamber 20. The gas dispenser 60 includes a plenum 62 operably coupled to the gas supply 30 and a distributor plate 70 having a plurality of holes 72. In operation, the workpiece holder 50 heats the workpiece W to a desired temperature, and the gas supply 30 selectively injects the first precursor $A_x$, the purge gas, and the second precursor $B_y$, as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, each $A_x$-purge-$B_y$-purge cycle can take several seconds. This results in a total process time of several minutes to form a 60 Å thick layer. In contrast to ALD processing, CVD techniques require only about one minute to form a 60 Å thick layer. The low throughput of existing ALD techniques limits the utility of the technology in its current state because it may be a bottleneck in the overall manufacturing process.

Another drawback of existing ALD reactors is that the purge pulses may not remove all of the $A_x$ or $B_y$ molecules from the reactor. As a result, during the pulse of the reactive gas $B_y$, remaining molecules of the reactive gas $A_x$ within the reactor volume will react with the $B_y$ molecules and produce unwanted particles in the chamber. This may cause defects and/or non-uniformities on the workpiece.

DETAILED DESCRIPTION

A. Overview

Figure 1A:
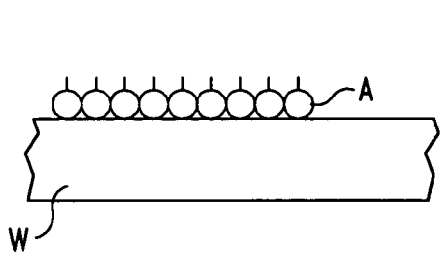
FIGS. 1A and 1B are schematic cross-sectional views of stages in an atomic layer deposition processing in accordance with the prior art.
Figure 1B:
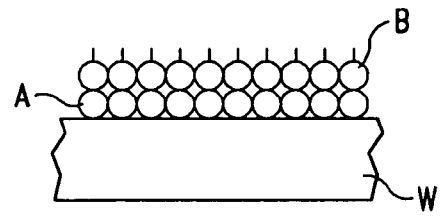
Figure 2:
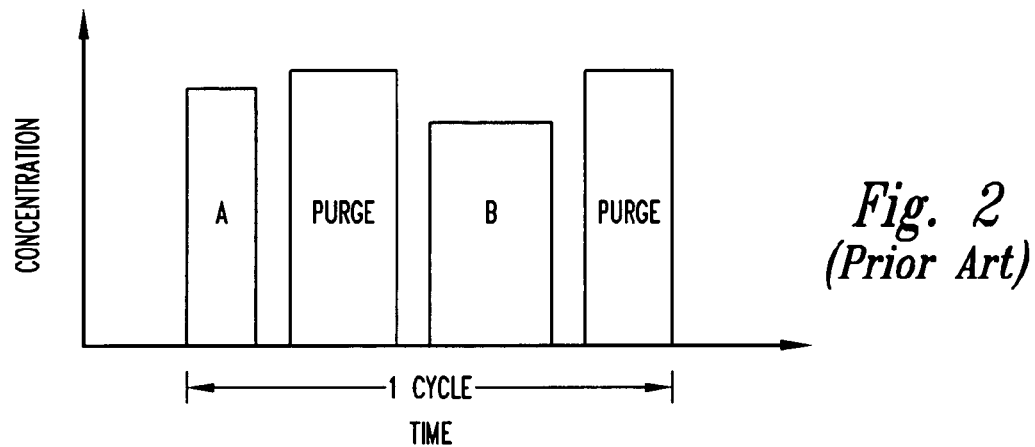
FIG. 2 is a graph illustrating a cycle for forming a layer of material using atomic layer deposition in accordance with the prior art.
Figure 3:
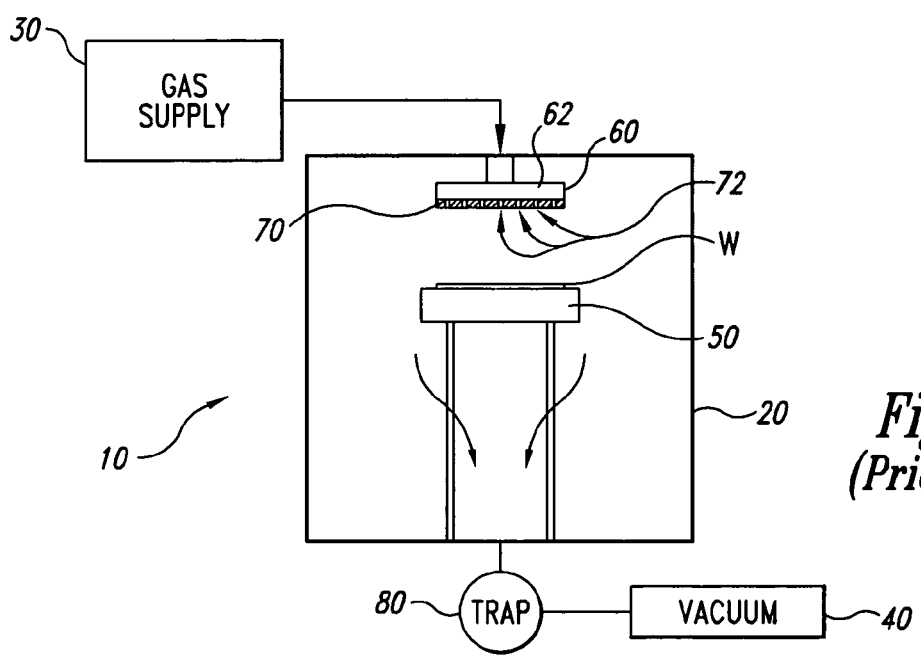
FIG. 3 is a schematic representation of a deposition system including a reactor for depositing material onto microfeature workpieces in accordance with the prior art.

The following disclosure describes several embodiments of reactors, systems and methods for depositing materials onto microfeature workpieces. Many specific details of the invention are described below with reference to single-wafer reactors for depositing a thin film onto microfeature workpieces, but the invention can also include batch systems for processing a plurality of workpieces simultaneously. Moreover, several embodiments of the invention can be used for depositing materials onto workpieces other than microelectronic or micro-mechanical workpieces, such as lenses or covers used in CMOS or CCD imaging devices. The term "microfeature workpiece" is accordingly used throughout to include substrates upon which and/or in which microelectronic devices, micromechanical devices, storage elements, lenses, optical covers, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4A-5B and the following text to provide a thorough understanding of the invention. A person skilled in the art will understand that the invention may have additional embodiments, or that the invention may be practiced without several of the details of the embodiments shown in FIGS. 4A-5B.

One aspect of the invention is directed toward reactors or systems for depositing thin films onto microfeature workpieces. An embodiment of one such reactor includes a reaction vessel having a chamber, a workpiece holder in the chamber, and a gas distributor attached to the reaction vessel. The workpiece holder includes a process site aligned with or otherwise superimposed with at least a portion of the gas distributor. The process site has an outer boundary that defines an area in which a workpiece is placed for processing. The gas distributor includes (a) a first inlet through which reactive gases can flow, (b) a primary dispenser having primary outlets superimposed with the process site and fluidically coupled to the first inlet, and (c) a peripheral dispenser around at least a portion of the primary dispenser. The peripheral dispenser has a second inlet and a perimeter outlet fluidically coupled to the second inlet. The perimeter outlet is superimposed with a region outside of the outer boundary of the process site so that a non-reactive gas can flow through the perimeter outlet and form a gas curtain around the microfeature workpiece.

Another embodiment of a reactor for depositing thin films on microfeature workpieces includes a reaction vessel having a chamber, a gas distributor attached to the reaction vessel, a workpiece holder in the chamber, and a side unit in the reaction vessel at a location relative to the gas distributor and/or the workpiece holder. The gas distributor has an inner compartment including a plurality of primary outlets open to the chamber, and the workpiece holder has a process site aligned with the primary outlets. The side unit surrounds at least a portion of the inner compartment and/or the process site on the workpiece holder. The side unit also has a secondary outlet open to the chamber that operates independently of the primary outlets. In this embodiment, the inner compartment, the side unit and/or the workpiece holder are movable relative to each other between a first position to form a small-volume cell for introducing the reactant gases to the microfeature workpiece and a second position to form a larger volume space for purging the reactant gases.

Still another embodiment of a reactor for depositing thin films onto microfeature workpieces includes a reaction vessel having a chamber, a gas distributor attached to the vessel, and a workpiece holder in the vessel. The gas distributor has primary outlets configured to direct precursor gases to a desired reaction site, and the workpiece holder is superimposed relative to the gas distributor. The gas distributor and/or the workpiece holder are movable with respect to each other to be spaced apart by a first distance during a pulse of precursor gas and a second distance greater than the first distance during a pulse of a purge gas. This reactor further includes a purge curtain having a secondary outlet aligned with a peripheral region of the workpiece holder to deliver a separate flow of a non-reactive gas around at least a portion of the perimeter of the workpiece.

A further embodiment of a reactor for depositing thin films on microfeature workpieces comprises a reaction vessel having a chamber, a workpiece holder in the chamber, a gas distributor attached to the vessel, and a purge curtain having a secondary outlet aligned with a peripheral region of the workpiece holder. The workpiece holder has a process site at which a workpiece is to be located, and the gas distributor has primary outlets configured to direct precursor gases to the process site. The gas distributor and/or the workpiece holder are movable with respect to each other. This embodiment of a reactor further includes a controller having a computer operable medium containing instructions to (a) move the gas distributor and/or the workpiece holder into a first position in which the primary outlets are spaced apart from the workpiece holder by a first distance, (b) deliver a flow of precursor gas through the primary outlets and a flow of purge gas through the secondary outlet while the primary outlets and the workpiece holder are spaced apart by the first distance, (c) move the gas distributor and/or the workpiece holder into a second position in which the primary outlets are spaced apart from the workpiece holder by a second distance greater than the first distance, and (d) deliver a pulse of purge gas while the primary outlets and the workpiece holder are spaced apart by the second distance.

Another aspect of the invention is directed toward methods for depositing materials onto microfeature workpieces. One embodiment of a method for depositing a thin film onto a microfeature workpiece comprises: (a) moving a gas distributor and/or a workpiece holder into a first position in which primary outlets of the gas distributor are spaced apart from the workpiece holder by a first distance; (b) concurrently delivering a flow of precursor gas through the primary outlets and a flow of purge gas through a secondary outlet separate from the primary outlets while the workpiece holder and the primary outlets are spaced apart by the first distance; (c) moving the gas distributor and/or the workpiece holder into a second position in which the primary outlets are spaced apart from the workpiece holder by a second distance greater than the first distance; and (d) dispensing a purge gas onto the workpiece while the primary outlets and the workpiece holder are spaced apart by the second distance.

Another method of depositing a thin film on a microfeature workpiece comprises: (a) dispensing a flow of a reactant material through primary outlets of a gas distributor and onto a microfeature workpiece; (b) dispensing a first flow of a non-reactant gas through a secondary outlet to flow adjacent to at least a portion of the periphery of the microfeature workpiece while dispensing the flow of the reactant gas through the primary outlets; (c) terminating the flow of the reactant material; and (d) dispensing a second flow of a non-reactant gas onto the microfeature workpiece to purge the reactant gas from the workpiece.

B. Deposition Systems

Figure 4A:
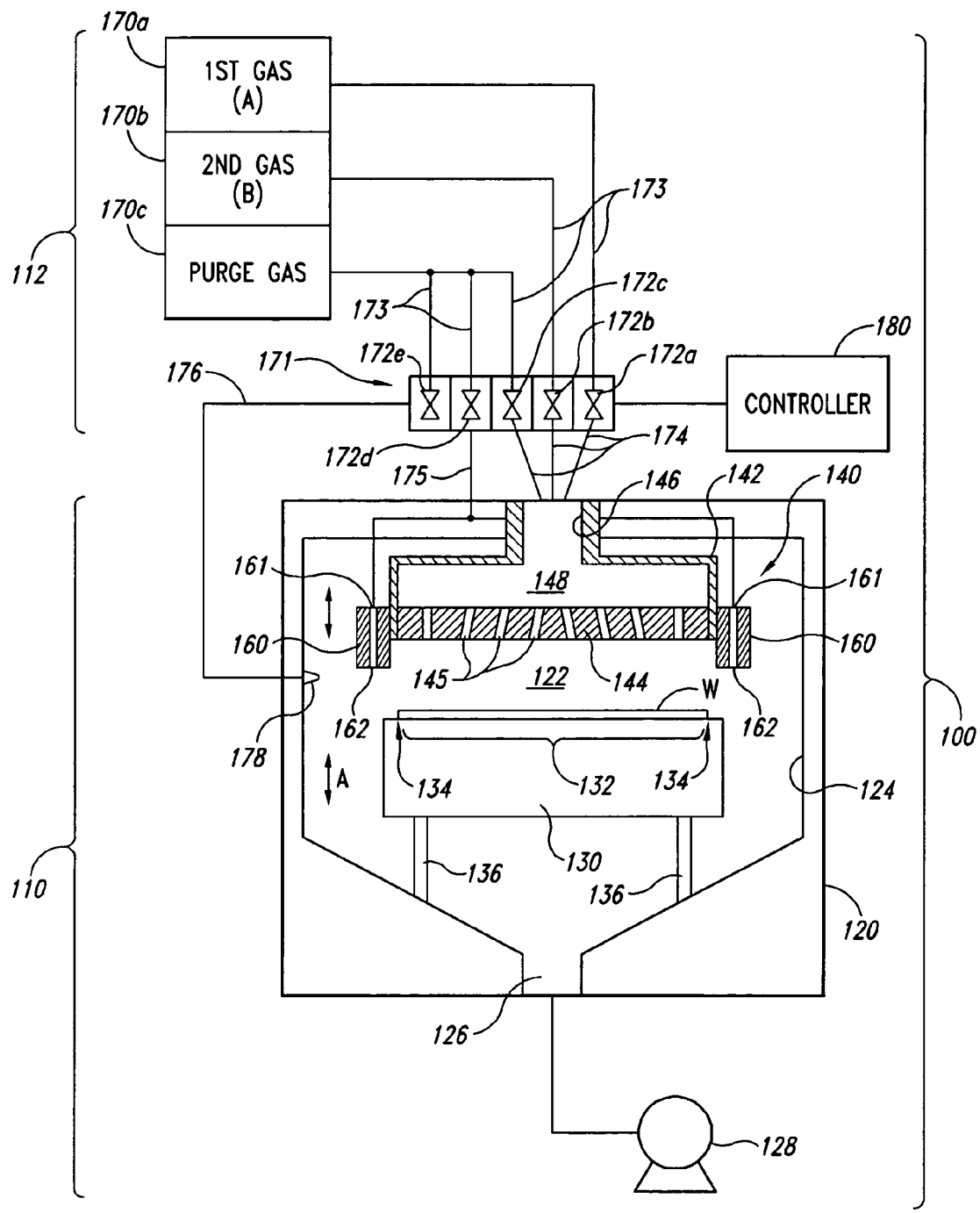
FIG. 4A is a schematic representation of a system having a reactor for depositing material onto microfeature workpieces in accordance with one embodiment of the invention.

FIG. 4A is a schematic representation of a system 100 for depositing a thin film of material onto a microfeature workpiece W in accordance with an embodiment of the invention. In this embodiment, the system 100 includes a reactor 110 and a gas supply 112 operatively coupled to the reactor 110. The reactor 110 includes a reaction vessel 120, a workpiece holder 130 in the reaction vessel 120, and a gas distributor 140 attached to the reaction vessel 120. The reactor 110 also includes a peripheral dispenser 160 that is either a component of the gas distributor 140 or a separate component in the reaction vessel 120. The gas distributor 140 and the peripheral dispenser 160 are coupled to various gas sources of the gas supply 112 to provide a peripheral barrier relative to the workpiece W that reduces the volume in which reactant gases are dispensed onto the workpiece W and enhances the separation between individual pulses of reactant gases.

In the embodiment shown in FIG. 4A, the reaction vessel 120 includes a low pressure chamber 122 defined by interior walls 124. The volume of the chamber 122 can be relatively large compared to the size of the workpiece W. The reaction vessel 120 typically includes an outlet 126 coupled to a vacuum pump 128 for providing a low pressure environment in the chamber 122.

The workpiece holder 130 is housed within the chamber 122 and has a platform including a process site 132 with an outer boundary 134 that defines an area in which the workpiece W is positioned for processing. The workpiece holder 130 typically includes a temperature control system that heats or cools the processing site 132 to hold the workpiece W at a desired temperature for the reaction. In this embodiment, the workpiece holder 130 further includes a moveable support 136 (shown schematically) that moves the workpiece holder 130 along a lift path (arrow A) between a first position and a second position. The moveable support 136 can have guide assembly (e.g., a frame or track) and an actuator (e.g., a servo motor that drives a lead-screw, worm gear, linkage system or other type of device). The platform is coupled to the guide assembly and the actuator to raise/lower the platform along the lift path. Alternatively, the moveable support 136 can have pneumatic or hydraulic cylinders attached to the platform. As explained in more detail below, the workpiece holder 130 and/or the gas distributor 140 are movable along a lift path between a first position and a second position to adjust the distance between the workpiece holder 130 and the gas distributor 140.

The embodiment of the gas distributor 140 shown in FIG. 4A is at least partially within the reaction vessel 120 and includes a compartment 142 having a distributor plate 144 with a plurality of primary outlets 145. The compartment 142 can be attached to the reaction vessel 120 and further include a first inlet 146 for receiving reactant gases and/or non-reactant gases from the gas supply 112. The embodiment of the compartment 142 shown in FIG. 4A defines an antechamber 148 into which individual reactant gases and/or mixtures of reactant gases are introduced into the reaction vessel 120. The gases then pass through the primary outlets 145 toward the processing site 132 to interact with the exposed surface of the workpiece W. In other embodiments, the gas distributor 140 can have dedicated lines coupled to one or more of the primary outlets 145 such that individual outlets are dedicated to dispensing a specific type of gas. The gas distributor 140 can be fixed to the reaction vessel 120, but in other embodiments the gas distributor 140 can further include an actuator to move the gas distributor along the lift path (arrow A) in addition to or in lieu of moving the workpiece holder 130.

The embodiment of the peripheral dispenser 160 illustrated in FIG. 4A is attached to the gas distributor 140. The peripheral dispenser 160, more specifically, is a rim fixed around the periphery of the gas distributor 140. The peripheral dispenser 160 further includes a second inlet 161 and a second outlet 162 fluidically coupled to the second inlet 161. The second outlet 162 is separate from the first outlet 146 such that the peripheral dispenser 160 can direct a gas flow relative to the workpiece W independently of the gas flow through the primary outlets 145. In the embodiment shown in FIG. 4A, the peripheral dispenser 160 includes a plurality of individual perimeter outlets 162, but other embodiments of the peripheral dispenser have a single annular second outlet. The second outlets 162 are superimposed with a region outside of the outer boundary 134 of the process site 132 to provide a gas "curtain" relative to the workpiece W. In a typical application, the peripheral dispenser 160 is coupled to a source of purge gas to provide a purge curtain relative to the workpiece W.

The reactor 110 operates in conjunction with the gas supply 112 to provide the appropriate sequence of gas pulses for ALD, pulsed CVD or continuous CVD deposition processes. The embodiment of the gas supply 112 shown in FIG. 4A includes a plurality of gas sources 170 (identified individually as 170*a-c*), a valve assembly 171 having a plurality of valves 172 (identified individually as 172*a-e*), and a plurality of gas lines 173-176. The gas sources 170 can include a first gas source 170*a* for providing a first precursor gas A, a second gas source 170*b* for providing a second precursor gas B, and a third gas source 170*c* for providing a purge gas P or other type of non-reactive gas. The first and second precursors A and B are generally the constituents that react to form the thin film on the workpiece W. The purge gas P is typically a non-reactive gas compatible with the reaction vessel 120, the workpiece W, and the first and second precursors A and B. In the illustrated embodiment, the first gas source 170*a* is coupled to a first valve 172*b* via a line 173, the second gas source 170*b* is coupled to a second valve 172*b* via a line 173, and the third gas source 170*c* is coupled to (a) a third valve 172*c*, (b) a fourth valve 172*d* and (c) a fifth valve 172*e* by lines 173.

The valves 172*a-e* are operated by a controller 180 that generates signals for delivering pulses of the individual gases to the reactor 110 via lines 174, 175 and 176. The controller 180, more specifically, operates the valves 172*a-e* to pulse the first precursor gas A, the second precursor gas B, and the purge gas P through the primary outlets 145, the second outlets 162, and a nozzle 178 at selected stages of a deposition process. The pulse widths, flow rates and pulse frequencies are generally set to accurately control the interaction between the precursor gases A and B in a manner that is expected to improve the quality of the thin film and enhance the throughput of the deposition process. The controller 180 is generally a computer having a computer operable medium containing instructions to carry out any of the methods described in FIGS. 4B-5B.

Figure 4B:
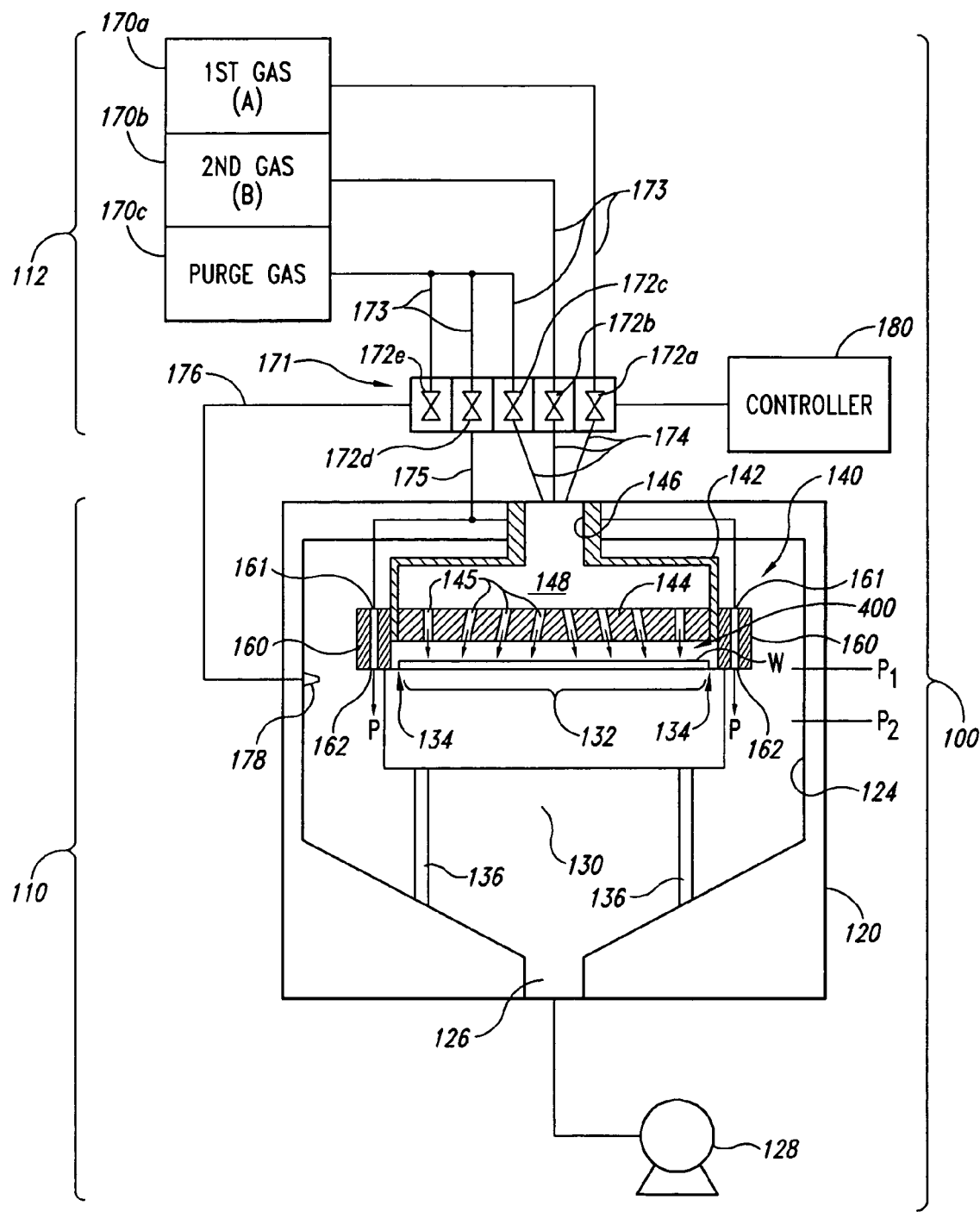
FIG. 4B is a schematic representation of the system shown in FIG. 4A at a stage of a method for depositing material onto microfeature workpieces in accordance with an embodiment of the invention.
Figure 4C:
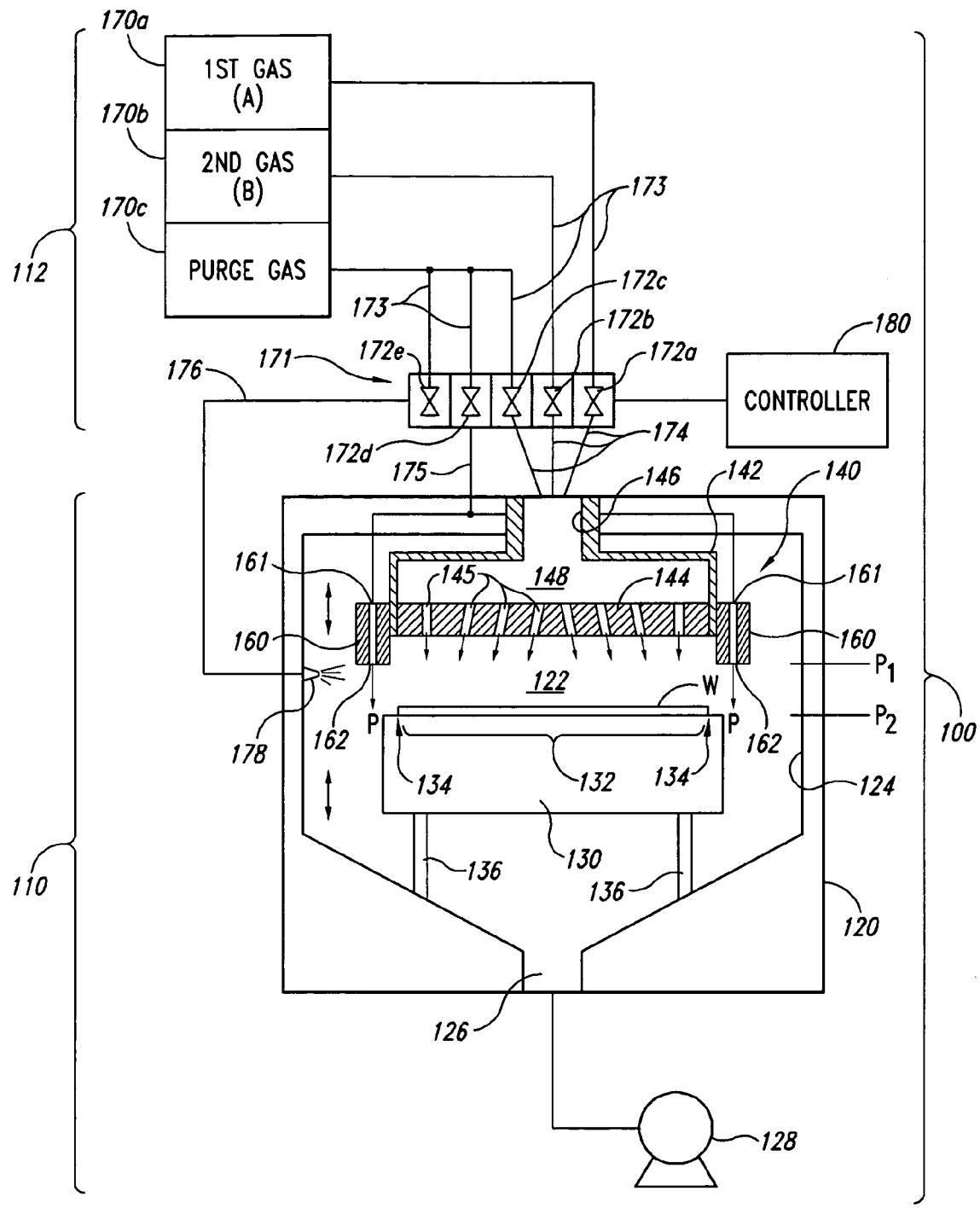
FIG. 4C is a schematic representation of the system shown in FIGS. 4A and 4B at a subsequent stage of a method for depositing materials onto microfeature workpieces in accordance with an embodiment of the invention.

FIGS. 4B and 4C illustrate stages of operating the system 100 in accordance with one embodiment of a method of the invention. Referring to FIG. 4B, the workpiece holder 130 is in a first position $P_1$ in which the primary outlets 145 of the gas distributor 140 are spaced apart from the workpiece holder 130 by a first distance to define a small volume cavity 400. While the workpiece holder 130 is in the first position $P_1$, the controller 180 opens the first valve 172a and the fourth valve 172d. The first precursor gas A accordingly flows through the primary outlets 145 and into the small volume cavity 400, and the purge gas P concurrently flows through the secondary outlet 162 to form a purge curtain (identified by arrows P) around the workpiece W and the workpiece holder 130. This stage of the process accordingly deposits a layer of molecules of the first precursor gas A onto the workpiece W, and excess molecules of the first precursor A are entrained in the flow of the purge curtain P and directed away from the process site 132. The controller 180 then closes valves 172a and 172d to terminate the flows of the first precursor gas A and purge gas P.

FIG. 4C illustrates a subsequent stage of the method in which the moveable support 136 has moved the workpiece holder 130 into a second position $P_2$ in which the primary outlets 145 are spaced apart from the workpiece holder 130 by a second distance greater than the first distance. The controller 180 then opens the third valve 172c and the fifth valve 172e so that the purge gas P flows through the primary outlets 145 and the nozzle 178 during a purge cycle. After the reaction vessel 120 has been purged of the first precursor gas A, the chamber 122 is pumped down to a suitable vacuum and the moveable support 136 raises the workpiece holder 130 to the first position $P_1$ (shown in FIG. 4B).

The controller then opens the second valve 172b and the fourth valve 172d while the workpiece holder is in the first position $P_1$. The second precursor gas B accordingly flows through the primary outlets 145 and into the small volume cavity 400, and the purge gas P flows through the secondary outlet 162. The purge curtain effectively inhibits remaining molecules of the first precursor A that were not removed from the chamber 122 by the purge cycle from entering the small volume cavity 400 during the pulse of the second precursor B. The purge gas P also carries excess molecules of the second precursor B away from the process site 132 so that errant reactions between the first and second precursors A and B occur away from the workpiece W. After the second precursor gas B coats the workpiece W, the controller 180 closes the second valve 172b and the fourth valve 172d, and the moveable support 136 lowers the workpiece holder 130 to the second position $P_2$. The purge process is then repeated as described above with reference to FIG. 4C.

The system 100 illustrated in FIGS. 4A-4C is expected to increase the throughput of thin film deposition processes. By raising the workpiece holder 130 to form a small volume cavity 400 in which the ALD half-reactions take place, the pulse widths of the first and second precursor gases A and B can be relatively short because they only need to flow through the small volume cavity 400 instead of the entire chamber 122. This not only reduces the time of the precursor pulses, but it also reduces the excess quantity of precursor molecules that need to be purged from the chamber 122. Accordingly, the pulse width of the purge gases can also be significantly shorter during the purge cycle compared to conventional processes. This is expected to increase the throughput of vapor deposition processes.

Another advantage of the embodiment of the system 100 illustrated in FIGS. 4A-4C is that the purge curtain directs excess molecules of the precursor gases away from the small volume cavity 400 where the ALD half-reactions take place. The excess molecules of the precursors are thus effectively separated from each other and inhibited from collecting on the interior surfaces 124 of the vessel 120. This is expected to reduce unwanted reactions between the first and second precursors within the reaction vessel 120, and it is expected to separate any such reactions from the workpiece W.

The system 100 illustrated above with reference to FIGS. 4A-4C can have several different embodiments. For example, instead of moving the workpiece holder 130 between the first and second positions $P_1$ and $P_2$, the gas distributor 140 can be moved between these positions to form the small volume cavity 400. Additionally, the system 100 can include more than two precursor gases and additional purge gases or other types of non-reactive gases. The purge gas P can also flow through the secondary outlet 162 during a purge cycle while the workpiece holder is in the second position $P_2$. In still additional embodiments, the controller 180 contains instructions to operate the moveable support 136 in conjunction with the valves 172a-e.

Figure 5A:
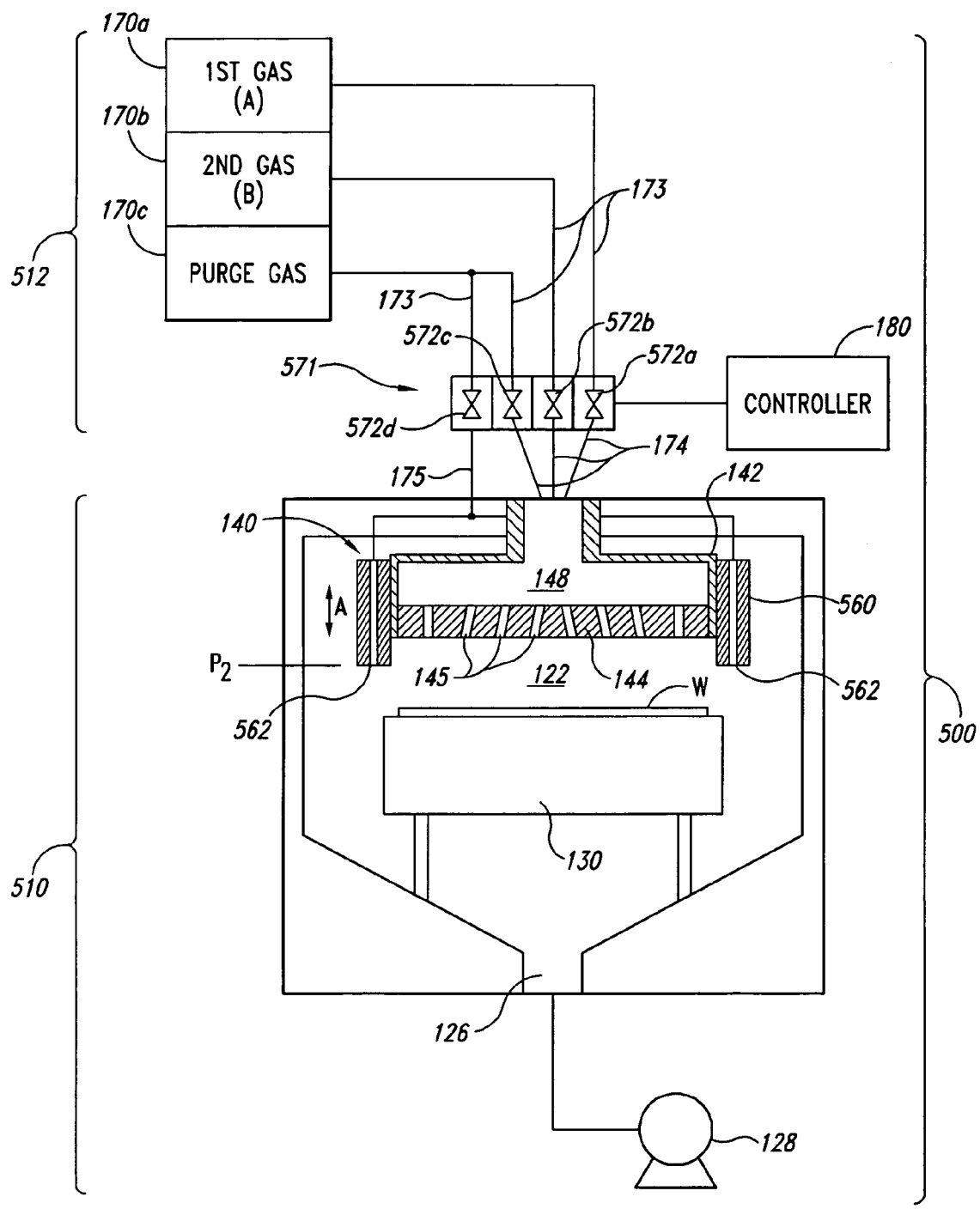
FIGS. 5A and 5B are schematic representations of a system having a reactor for depositing a material onto microfeature workpieces in accordance with another embodiment of the invention.
Figure 5B:
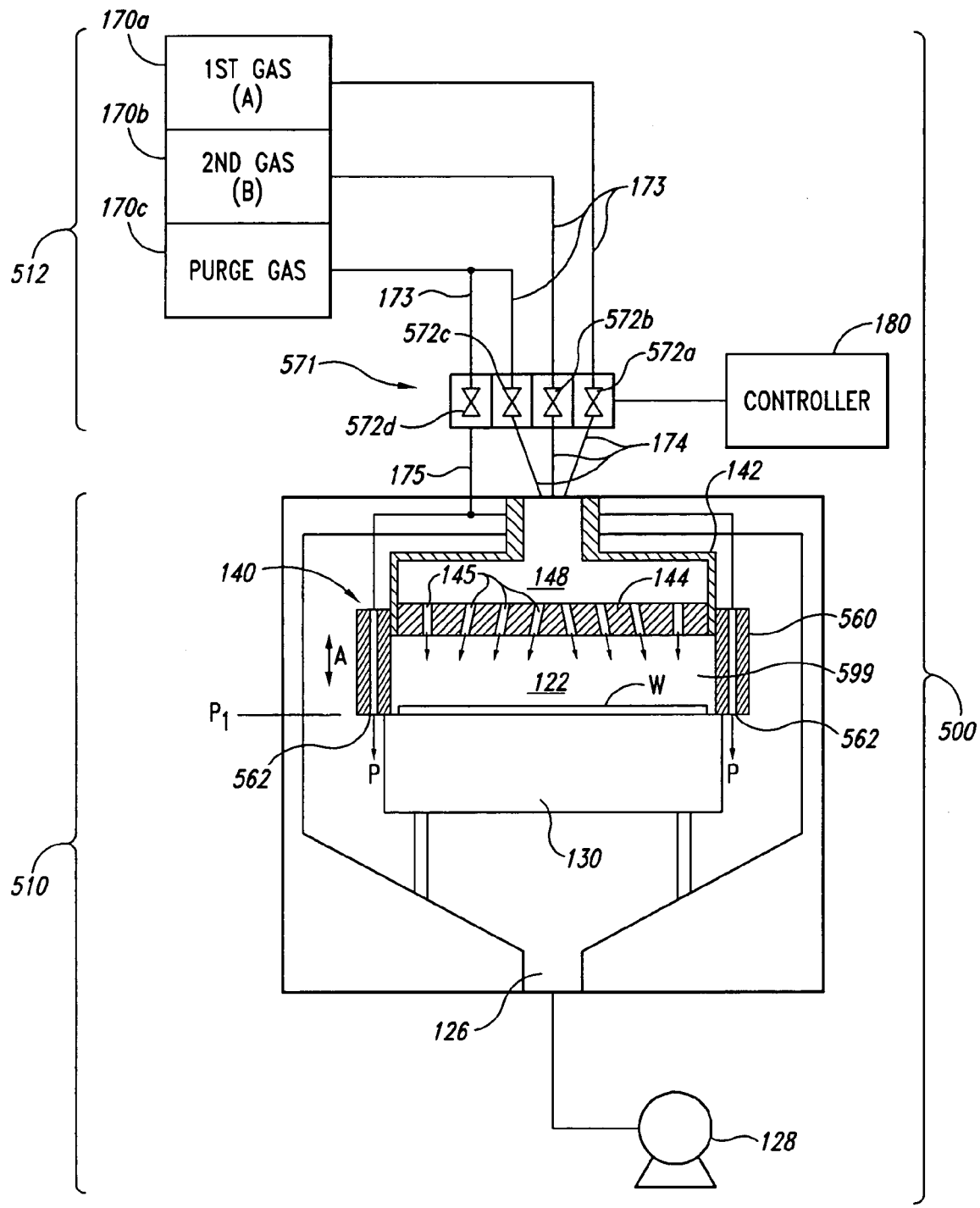

FIGS. 5A and 5B illustrate a system 500 for depositing a thin film onto microfeature workpieces in accordance with another embodiment of the invention. The system 500 is similar to the system 100 described above with reference to FIGS. 4A-4C, and thus like reference numbers refer to like components in FIGS. 4A-5B. The system 500 includes a reactor 510 including the workpiece holder 130, the gas distributor 140, and a movable peripheral dispenser 560. The embodiment of the peripheral dispenser 560 shown in FIG. 5A is movably attached to the gas distributor 140 to move along a lift path A relative to the workpiece holder 130. The peripheral dispenser 560, however, can be attached to the interior surfaces 124 of the reaction vessel 120 instead of the gas distributor 140. The peripheral dispenser 560 includes a second outlet 562 aligned with a peripheral region of the workpiece holder 130. The gas supply 512 includes the gas sources 170 and a valve assembly 571 having four valves 572a-d. The gas supply 512 has four valves instead of five valves as shown in FIGS. 4A-4C because the reactor 510 does not include a side nozzle for the purge gas.

In operation, the peripheral dispenser 560 moves downward to a first position $P_1$ (FIG. 5B) to form a small volume cavity 599 having a volume less than the volume of the chamber 122. The controller 180 then opens the first valve 172a and the fourth valve 172d to flow the first precursor A through the primary outlets 145 and the purge gas through the second outlet 562. The peripheral dispenser 560 then moves to a second position $P_2$ (FIG. 5A), and the controller 180 operates the valve assembly 571 so that the purge gas flows through the first outlets 145 and/or the second outlet 162 to purge excess molecules of the precursor gases from the chamber 122.

From the foregoing, it will be appreciated that specific embodiments of the invention have been described herein for purposes of illustration, but that various modifications may be made without deviating from the spirit and scope of the invention. For example, the peripheral dispenser can be a side unit that is fixed to or moveably carried by (a) the gas distributor, (b) the workpiece support, and/or (c) the reaction vessel. Accordingly, the invention is not limited except as by the appended claims.

We claim:

1. A reactor for depositing thin films on microfeature workpieces, comprising:

a reaction vessel having a chamber;

a gas distributor attached to the reaction vessel, the gas distributor having an inner compartment including a plurality of primary outlets open to the chamber;

a workpiece holder in the chamber, the workpiece holder having a process site aligned with the primary outlets along a lift path, and the process site having an outer boundary; and a side unit in the reaction vessel at a location relative to the gas distributor and/or the workpiece holder, the side unit surrounding at least a portion of the inner compartment, and the side unit having a bottom surface below the primary outlets and a downwardly facing secondary outlet at the bottom surface configured to direct a downwardly flowing gas curtain through a region outside of the outer boundary of the process site, wherein (a) the secondary outlet operates independently of the primary outlets and (b) the inner compartment, the side unit and/or the workpiece holder are moveable along the lift path between a first position and a second position;

wherein an inner portion of the bottom surface of the side unit is superimposed over an outer portion of the workpiece holder such that the inner portion of the bottom surface contacts the outer portion of the workpiece holder in the first position.

2. The reactor of claim 1 wherein the workpiece holder is moveable between a first position in which the workpiece holder is spaced apart from the primary outlets by a first distance and a second position in which the workpiece holder is spaced apart from the primary outlets by a second distance greater than the first distance.

3. The reactor of claim 1 wherein the workpiece holder further comprises a guide assembly, an actuator, and a platform attached to the guide assembly and the actuator.

4. The reactor of claim 1 wherein the gas distributor is moveable between a first position in which the workpiece holder is spaced apart from the primary outlets by a first distance and a second position in which the workpiece holder is spaced apart from the primary outlets by a second distance greater than the first distance.

5. The reactor of claim 1 wherein the side unit is moveable between a first position in which the workpiece holder is spaced apart from the primary outlets by a first distance and a second position in which the workpiece holder is spaced apart from the primary outlets by a second distance greater than the first distance.

6. The reactor of claim 1 wherein the side unit comprises a lip fixed to the gas distributor, and wherein the lip projects away from the gas distributor toward the workpiece holder.

7. The reactor of claim 1 wherein:

the gas distributor further comprises a distributor plate at the bottom of the inner compartment, and the primary outlets are in the distributor plate; and the side unit comprises an annular lip fixed to a perimeter of the gas distributor, the lip depending downwardly below the distributor plate, and the secondary outlet comprising a plurality of openings along the lip.

8. The reactor of claim 1 wherein:

the gas distributor comprises a distributor plate at the bottom of the inner compartment, and the primary outlets are in the distributor plate; and the secondary outlet comprises a plurality of openings.

9. A system for depositing thin films on microfeature workpieces, comprising:

a gas supply having a reactant gas source and a purge gas source; and a reactor comprising—

(1) a reaction vessel having a chamber;

(2) a gas distributor attached to the reaction vessel, the gas distributor having an inner compartment and a distributor plate including a plurality of primary outlets open to the chamber;

(3) a workpiece holder in the chamber, the workpiece holder having a process site aligned with the primary outlets along a lift path, and the processing site having an outer boundary; and (4) a side unit operatively coupled to the purge gas source, the side unit surrounding at least a portion of the inner compartment and/or the process site and having downwardly facing secondary outlets below the distributor plate that are configured to direct a downwardly flowing purge gas curtain through a region outside of the outer boundary of the process site, wherein (a) the secondary outlets operate independently of the primary outlets and (b) the inner compartment, the side unit and/or the workpiece holder are moveable along the lift path;

wherein an inner portion of the bottom surface of the side unit is superimposed over an outer portion of the workpiece holder such that the inner portion of the bottom surface contacts the outer portion of the workpiece holder in the first position.

10. The system of claim 9 wherein the workpiece holder is moveable between a first position in which the workpiece holder is spaced apart from the primary outlets by a first distance and a second position in which the workpiece holder is spaced apart from the primary outlets by a second distance greater than the first distance.

11. The system of claim 9 wherein the workpiece holder further comprises a guide assembly, an actuator, and a platform attached to the guide assembly and the actuator.

12. The system of claim 9 wherein the gas distributor is moveable between a first position in which the workpiece holder is spaced apart from the primary outlets by a first distance and a second position in which the workpiece holder is spaced apart from the primary outlets by a second distance greater than the first distance.

13. The system of claim 9 wherein the side unit is moveable between a first position in which the workpiece holder is spaced apart from the primary outlets by a first distance and a second position in which the workpiece holder is spaced apart from the primary outlets by a second distance greater than the first distance.

14. The system of claim 9 wherein the side unit comprises a lip fixed to the gas distributor, and wherein the lip projects away from the gas distributor toward the workpiece holder.

15. The system of claim 9 wherein:

the gas distributor further comprises a distributor plate at the bottom of the inner compartment, and the primary outlets are in the distributor plate; and the side unit comprises an annular lip fixed to a perimeter of the gas distributor, the lip depending downwardly below the distributor plate, and the secondary outlet comprising a plurality of openings along the lip.

16. The system of claim 9 wherein:

the gas distributor comprises a distributor plate at the bottom of the inner compartment, and the primary outlets are in the distributor plate; and the secondary outlet comprises a plurality of openings along the lip.

* * * * *